United States Patent
Hsieh

(10) Patent No.: US 10,374,626 B2
(45) Date of Patent: Aug. 6, 2019

(54) INTERLEAVING QUANTIZER IN CONTINUOUS-TIME DELTA-SIGMA MODULATOR FOR QUANTIZATION LEVEL INCREMENT

(71) Applicant: MEDIATEK INC., Hsin-Chu (TW)

(72) Inventor: Hung-Yi Hsieh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/134,960

(22) Filed: Sep. 18, 2018

(65) Prior Publication Data

US 2019/0158111 A1    May 23, 2019

Related U.S. Application Data

(60) Provisional application No. 62/589,609, filed on Nov. 22, 2017, provisional application No. 62/664,376, filed on Apr. 30, 2018.

(51) Int. Cl.
*H03M 3/00* (2006.01)

(52) U.S. Cl.
CPC ........... *H03M 3/342* (2013.01); *H03M 3/344* (2013.01); *H03M 3/436* (2013.01)

(58) Field of Classification Search
CPC ....... H03M 3/342; H03M 3/344; H03M 3/436
USPC .......................................... 341/143
See application file for complete search history.

(56) References Cited

U.S. PATENT DOCUMENTS

| | | | |
|---|---|---|---|
| 5,012,244 A | 4/1991 | Wellard | |
| 9,455,737 B1 * | 9/2016 | Rajaee | H03M 3/464 |
| 9,543,977 B2 * | 1/2017 | Lin | H03M 3/462 |
| 9,577,662 B2 * | 2/2017 | Wei | H03M 3/37 |
| 9,843,337 B1 * | 12/2017 | Li | H03M 1/0673 |

FOREIGN PATENT DOCUMENTS

| | | |
|---|---|---|
| TW | 201220713 A1 | 5/2012 |
| TW | 201501474 A | 1/2015 |
| TW | 201711399 A | 3/2017 |

OTHER PUBLICATIONS

Saska Lindfors et al., Two-Step Quantization in Multibit ΔΣ Modulators, IEEE Transactions on Circuits and Systems—II: Analog and Digital Signal Processing, vol. 48, No. 2, Feb. 2001, pp. 171-176, XP055572200.

Yi Ke et al., Optimal Design Methodology for High-Order Continuous-Time Wideband Delta-Sigma Converters, 2007 IEEE, pp. 743-746, XP031248361, Dec. 11, 2007.

* cited by examiner

*Primary Examiner* — Brian K Young
(74) *Attorney, Agent, or Firm* — Winston Hsu

(57) ABSTRACT

The present invention provides a continuous-time delta-sigma modulator comprising two ADCs. One of the ADC is configured to generate MSBs of an output signal of the continuous-time delta-sigma modulator, and the other ADC is configured to generate LSBs of the output signal. In addition, the two ADCs sample an output of a loop filter at different times, but the MSBs and LSBs are feedback to the loop filter simultaneously.

15 Claims, 5 Drawing Sheets

INTERLEAVING QUANTIZER IN CONTINUOUS-TIME DELTA-SIGMA MODULATOR FOR QUANTIZATION LEVEL INCREMENT

CROSS REFERENCE TO RELATED APPLICATIONS

This application claims the priority of U.S. Provisional Application No. 62/589,609, filed on Nov. 22, 2017, and U.S. Provisional Application No. 62/664,376, filed on Apr. 30, 2018, which is included herein by reference in its entirety.

BACKGROUND

In a continuous-time delta-sigma modulator (CTDSM), a time difference between a quantizer and a feedback signal is called an excess loop delay (ELD). The ELD of the CTDSM has to be less than on sampling period, otherwise the quantization noise will increase and the CTDSM loop will become unstable. For example, if the ELD is designed to have a delay amount 0.5*Ts (Ts is the sampling period), the quantizer needs to make a decision within 0.5*Ts. Therefore, the decision time for bit cycling is restricted by the delay amount of the ELD, and the remaining time of the sampling period is wasted. Furthermore, because of the requirements of the wider bandwidth of the continuous-time delta-sigma modulator and the faster sampling rate, 0.5*Ts may not be enough for the bit(s) decision.

SUMMARY

It is therefore an objective of the present invention to provide a CTDSM, which can sample an output of the loop filter at different times to fully use the sampling period, to solve the above-mentioned problems.

According to one embodiment of the present invention, a continuous-time delta-sigma modulator comprises a receiving circuit, a loop filter, a first ADC, a second ADC, a combiner and a feedback circuit. In the operations of the continuous-time delta-sigma modulator, the receiving circuit is arranged for receiving an input signal and a feedback signal to generate a first signal; the loop filter is arranged for filtering the first signal to generate a filtered signal; the first ADC is arranged for sampling the filtered signal to generate a first digital signal; the second ADC is arranged for sampling upon the filtered signal to generate a second digital signal; the combiner is arranged for combining the first digital signal and the second digital signal to generate an output signal of the continuous-time delta-sigma modulator; and the feedback circuit is coupled to the first ADC and the second ADC, and is arranged for generating at least one feedback signal according to the first digital signal and the second digital signal. In addition, the first ADC and the second ADC sample the filtered signal at different times, and the first digital signal generated by the first ADC and the second digital signal generated by the second ADC are provided to the feedback circuit.

According to another embodiment of the present invention, a continuous-time delta-sigma modulator comprises a receiving circuit, a loop filter, an ADC, a combiner and a feedback circuit. In the operations of the continuous-time delta-sigma modulator, the receiving circuit is arranged for receiving an input signal and a feedback signal to generate a first signal, the loop filter is arranged for filtering the first signal to generate a filtered signal, the ADC is arranged for sampling the filtered signal to generate a first digital signal, and sampling the filtered signal to generate a second digital signal at different times, and the combiner is arranged for combining the first digital signal and the second digital signal to generate an output signal of the continuous-time delta-sigma modulator, and the feedback circuit is arranged for generating at least one feedback signal according to the first digital signal and the second digital signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
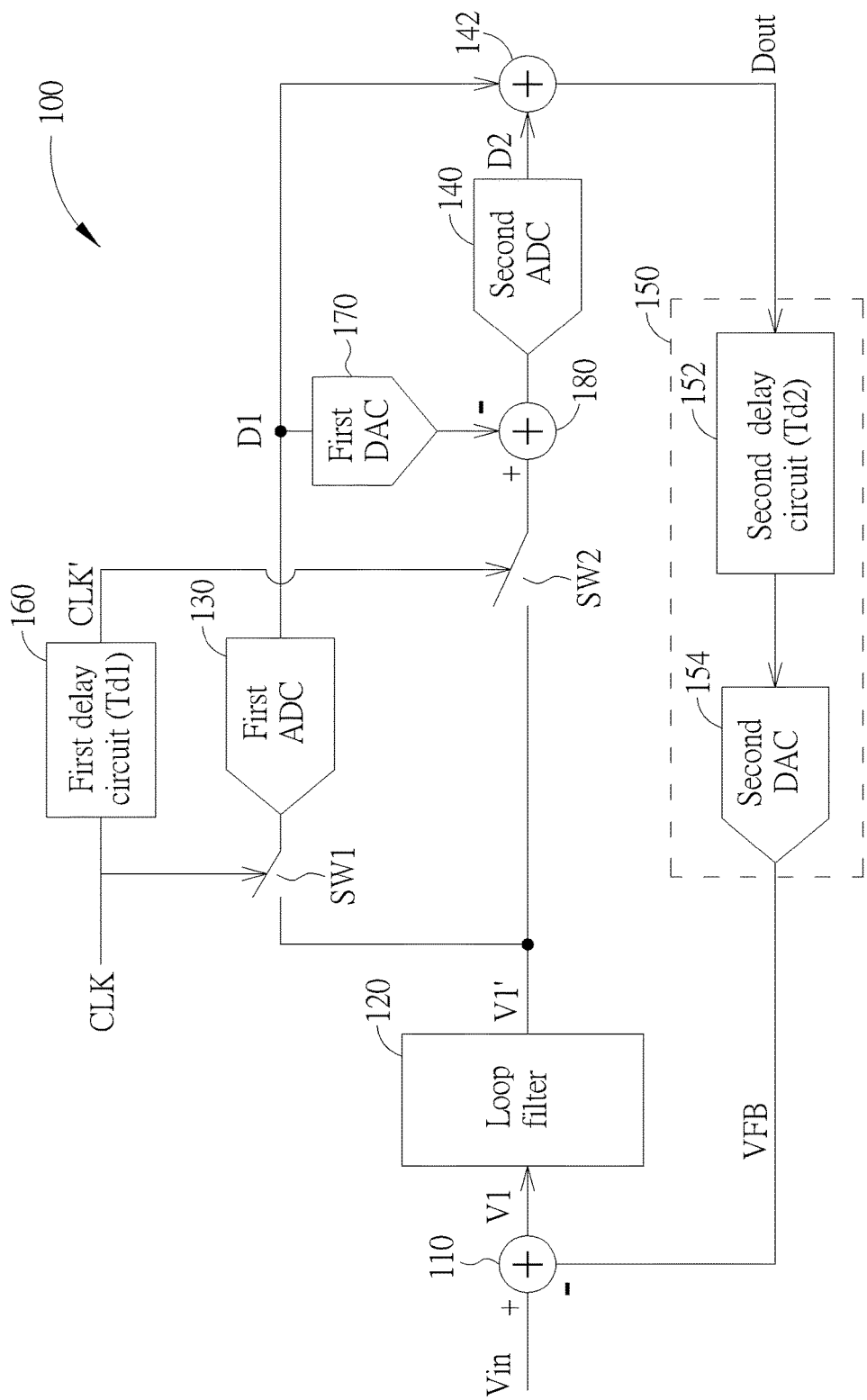
FIG. 1 is a diagram illustrating a CTDSM according to a first embodiment of the present invention.

FIG. 1 is a diagram illustrating a CTDSM 100 according to a first embodiment of the present invention. As shown in FIG. 1, the CTDSM 100 comprises a receiving circuit 110, a loop filter 120, a first analog-to-digital converter (ADC) 130, a second ADC 140, a combiner 142, a feedback circuit 150, a first delay circuit 160, a first digital-to-analog converter (DAC) 170, a subtractor 180 and switches SW1 and SW2, where the feedback circuit 150 comprises a second delay circuit (excess loop delay (ELD)) 152 and a second DAC 154. In this embodiment, the first ADC 130, the second ADC 140, the first DAC 170 and the second DAC 154 are distinct elements.

In this embodiment, the CTDSM 100 is configured to receive an input signal (analog signal) Vin to generate a multi-bit output signal (digital signal) Dout, and the first ADC 130 and the second ADC 140 within the CTDSM 100 are configured to generate different parts of the output signal Dout at different times to fully use the entire sampling period.

Specifically, in the operations of the CTDSM 100, the receiving circuit 110 receives the input signal Vin and a feedback signal VFB to generate a first signal V1, and the loop filter 120 filters the first signal V1 to generate a filtered signal V1'. Then, the first ADC 130 samples the filtered signal V1' via the first switch SW1 controlled by a first clock signal CLK to generate a first digital signal D1, where the first ADC 130 can be regarded as a course ADC for generating the MSB(s) of the output signal Dout of the CTDSM 100. Then, the second ADC 140 samples the filtered signal V1' via the second switch SW2 controlled by a second clock signal CLK' to generate a second digital signal D2, where the second clock signal CLK' is generated by using the first delay circuit 160 to delay the first clock signal CLK, and the second ADC 140 is configured to generate the LSB(s) of the output signal Dout of the CTDSM 100. In detail, because the phase of the second clock signal CLK' is later than the first clock signal CLK, the first digital signal D1 may be successfully determined before the second ADC 140 starts to sample the filtered signal V1'. Therefore, the first DAC 170 performs the digital-to-analog converting operations upon the first digital signal D1 to generate an analog signal, and the subtractor 180 subtracts the analog signal from the filtered signal V1 to generate a residual signal, and the second ADC 140 performs the analog-to-digital converting operations upon the residual signal to generate the second digital signal D2. Then, the combiner 142 combines the first digital signal D1 and the second digital signal D2 to generate the output signal Dout, and the output signal Dout is processed by the second delay circuit 152 and the second DAC 154 to generate the feedback signal VFB.

Figure 2:
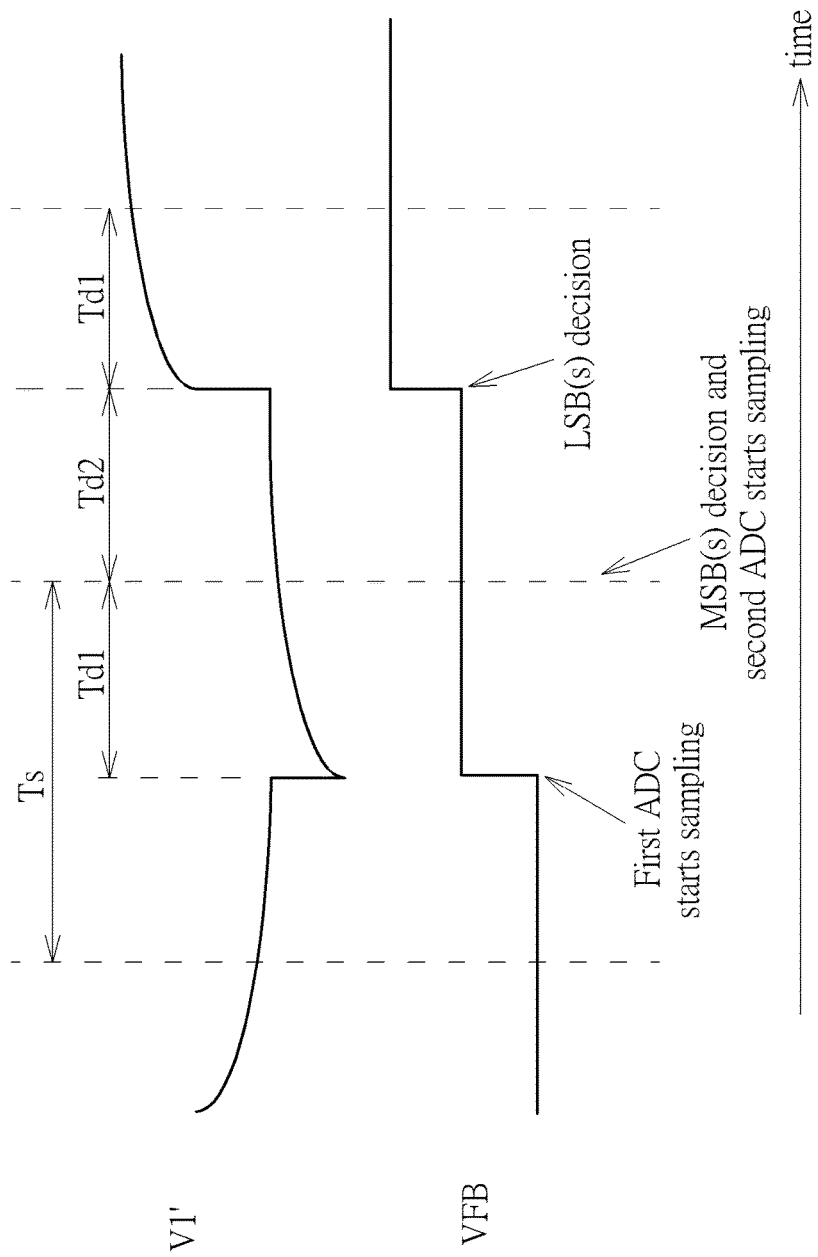
FIG. 2 shows a timing diagram of the CTDSM according to one embodiment of the present invention.

FIG. 2 shows a timing diagram of the CTDSM 100 according to one embodiment of the present invention. In the embodiment shown in FIG. 1 and FIG. 2, the first delay circuit 160 is configured to provide a first delay amount Td1 (i.e. the second clock signal CLK' and the first clock signal CLK have a phase difference Td1), and the second delay circuit 152 is configured to provide a second delay amount Td2, where a summation of the first delay amount Td1 and the second delay amount Td2 is less than or equal to a sampling period Ts (e.g. one cycle of CLK/CLK'), for example, each of Td1 and Td2 may be 0.5*Ts. Refer to FIG. 2, the first ADC 130 starts to sample the filtered signal V1' and successfully determine the first digital signal D1 (i.e. MSB(s)) during the first period Td1, then the second ADC 140 starts to sample the filtered signal V1' and successfully determine the second digital signal D2 (i.e. LSB(s)) during the second period Td2, and the first digital signal D1 and the second digital signal D2 are combined and feedback to the receiving circuit 110 via the feedback circuit 150 simultaneously.

It is noted that the examples of the first delay amount Td1 and the second delay amount Td2 (e.g. 0.5*Ts) are for illustrative purposes only, and not a limitation of the present invention. In other embodiments of the present invention, the first delay amount Td1 may be shorter and the second delay amount Td2 may be longer, and/or the summation of the first delay amount Td1 and the second delay amount Td2 may be less than the sampling period Ts.

In the conventional CTDSM having only one ADC, the bit-decision must be made within the second period Td2 as shown in FIG. 2, and the conventional CTDSM does not do any decision within the first period Td1, that is the first period Td1 is wasted. Compared with the conventional CTDSM, the CTDSM 100 of the present invention can determine the MSB(s) and LSB(s) within the first period Td1 and the second period Td2, respectively, to fully use the sampling period.

Because the overall decision time of the CTDSM 100 is doubled (i.e. periods Td1 and Td2 are used for bit-decision), the second delay amount Td2 provided by the second delay circuit 152 can be kept the same as a conventional CTDSM to efficiently reduce the quantization noise in a low oversampling ratio (OSR) CTDSM. In addition, because all the contents of the output signal Dout are provided to the feedback circuit 150 (i.e. none of the information is truncated), there is no additional quantization noise added to the CTDSM 100. Furthermore, because each of the first ADC 130 and the second ADC 140 is configured to generate only a portion of the output signal Dout, the first ADC 130 and/or the second ADC 140 can be designed to have less comparators or provide enough time for more bit cycling.

Figure 3:
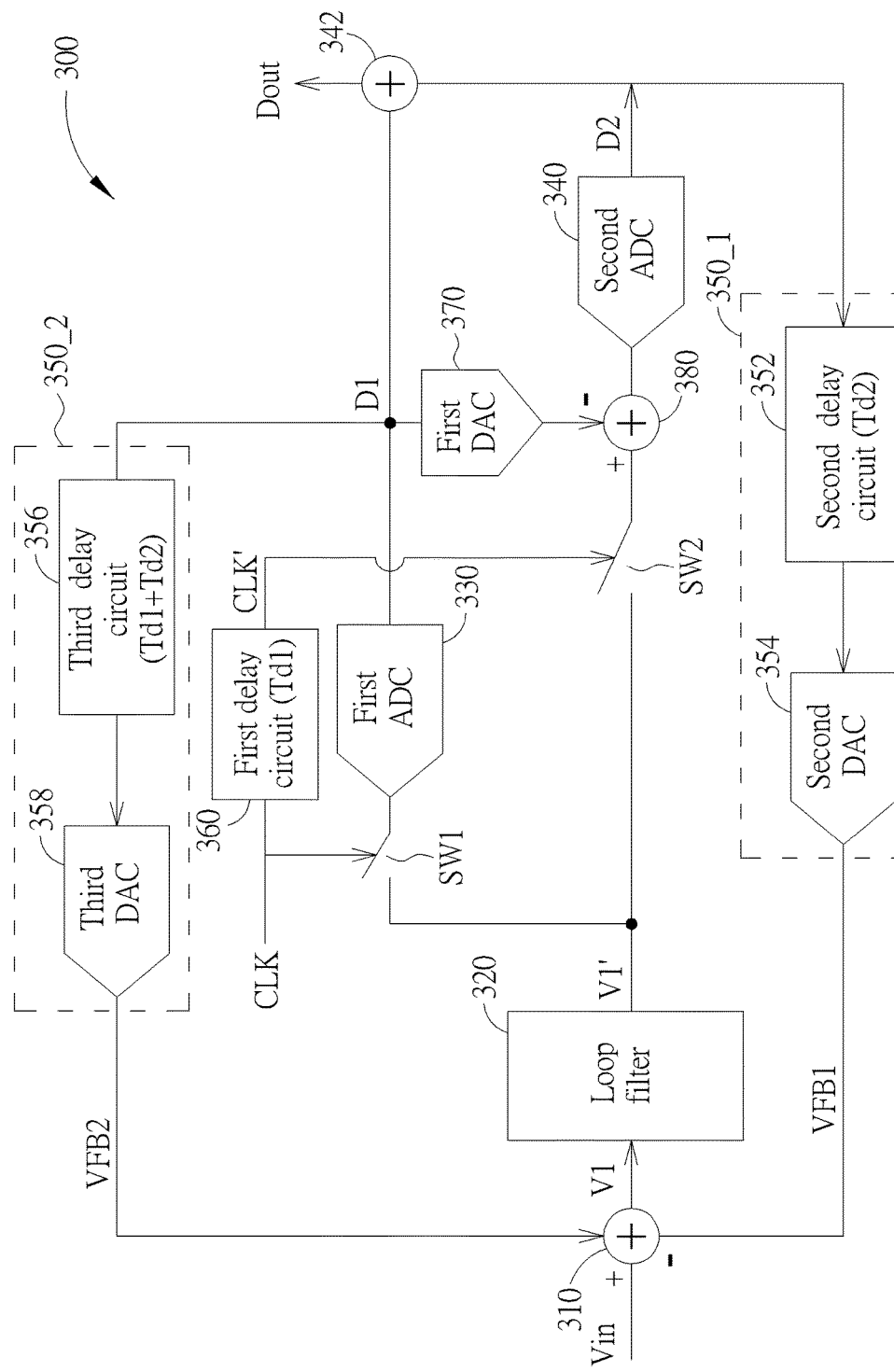
FIG. 3 is a diagram illustrating a CTDSM according to a second embodiment of the present invention.

FIG. 3 is a diagram illustrating a CTDSM 300 according to a second embodiment of the present invention. As shown in FIG. 3, the CTDSM 300 comprises a receiving circuit 310, a loop filter 320, a first ADC 330, a second ADC 340, a combiner 342, two feedback circuits 350_1 and 350_2, a first delay circuit 360, a first DAC 370, a subtractor 380 and two switches SW1 and SW2, where the feedback circuit 350_1 comprises a second delay circuit 352 and a second DAC 354, and the feedback circuit 350_2 comprises a third delay circuit 356 and a third DAC 358. In this embodiment, the first ADC 330, the second ADC 340, the first DAC 370, the second DAC 354 and the third DAC 358 are distinct elements.

In this embodiment, the CTDSM 300 is configured to receive an input signal (analog signal) Vin to generate a multi-bit output signal (digital signal) Dout, and the first ADC 330 and the second ADC 340 within the CTDSM 300 are configured to generate different parts of the output signal Dout at different times to fully use the entire sampling period.

Specifically, in the operations of the CTDSM 300, the receiving circuit 310 receives the input signal Vin and two feedback signals VFB1 and VFB2 to generate a first signal V1, and the loop filter 320 filters the first signal V1 to generate a filtered signal V1'. Then, the first ADC 330 samples the filtered signal V1' via the first switch SW1 controlled by a first clock signal CLK to generate a first digital signal D1, where the first ADC 330 can be regarded as a course ADC for generating the MSB(s) of the output signal Dout of the CTDSM 300. Then, the second ADC 340 samples the filtered signal V1' via the second switch SW2 controlled by a second clock signal CLK' to generate a second digital signal D2, where the second clock signal CLK' generated by using the first delay circuit 360 to delay the first clock signal CLK, and the second ADC 340 is configured to generate the LSB(s) of the output signal Dout of the CTDSM 300. In detail, because the phase of the second clock signal CLK' is later than the first clock signal CLK, the first digital signal D1 may be successfully determined before the second ADC 340 starts to sample the filtered signal V1'. Therefore, the first DAC 370 performs the digital-to-analog converting operations upon the first digital signal D1 to generate an analog signal, and the subtractor 380 subtracts the analog signal from the filtered signal V1' to generate a residual signal, and the second ADC 340 performs the analog-to-digital converting operations upon the residual signal to generate the second digital signal D2. Then, the combiner 342 combines the first digital signal D1 and the second digital signal D2 to generate the output signal Dout. In the embodiment shown in FIG. 3, the second digital signal D2 is processed by the second delay circuit 352 and the second DAC 354 to generate the feedback signal VFB1, and the first digital signal D1 is processed by the third delay circuit 356 and the third DAC 358 to generate the feedback signal VFB2.

The timing diagram of the CTDSM 300 is also referred to the embodiment shown in FIG. 2. The first delay circuit 360 is configured to provide a first delay amount Td1 (i.e. the second clock signal CLK' and the first clock signal CLK have a phase difference Td1), the second delay circuit 352 is configured to provide a second delay amount Td2, the third delay circuit 356 is configured to provide a third delay amount (Td1+Td2), where a summation of the first delay amount Td1 and the second delay amount Td2 is less than or equal to a sampling period Ts (e.g. one cycle of CLK/CLK').

In the embodiment shown in FIG. 3, because the overall decision time of the CTDSM 300 is doubled (i.e. periods Td1 and Td2 are used for bit-decision), the second delay amount Td2 provided by the second delay circuit 352 can be kept the same as a conventional CTDSM to efficiently reduce the quantization noise in the low OSR CTDSM. In addition, because the combiner 342 is positioned outside the feedback loop, that is the first digital signal D1 and the second digital signal D2 are provided to the feedback circuits 350_2 and 350_1, respectively, without being combined first, the feedback speed may be faster than the embodiment shown in FIG. 1.

Figure 4:
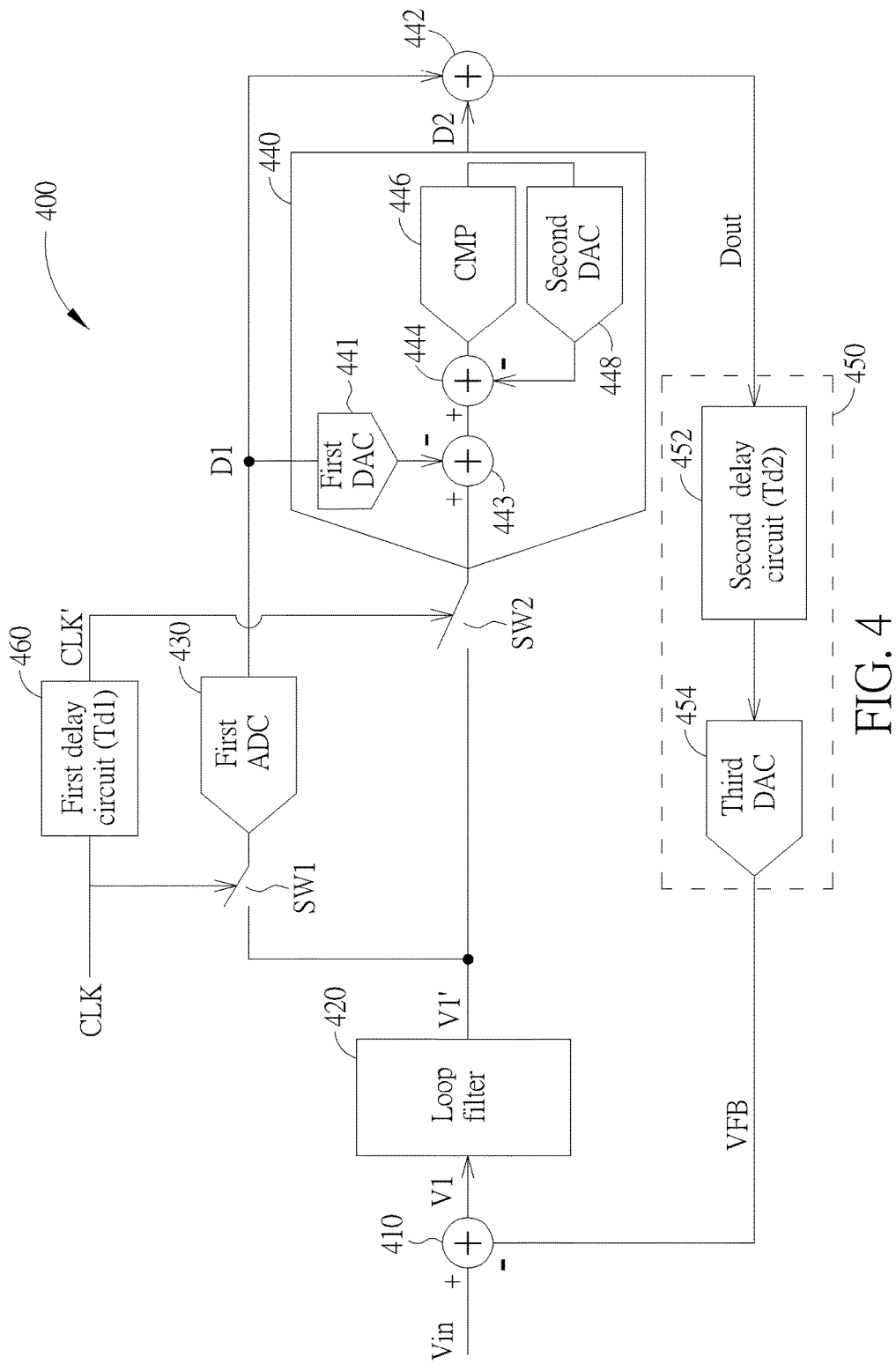
FIG. 4 is a diagram illustrating a CTDSM according to a third embodiment of the present invention.

FIG. 4 is a diagram illustrating a CTDSM 400 according to a third embodiment of the present invention. As shown in FIG. 4, the CTDSM 400 comprises a receiving circuit 410, a loop filter 420, a first ADC 430, a second ADC 440, a combiner 442, a feedback circuit 450, a first delay circuit 460 and two switches SW1 and SW2, where second ADC 440 is a successive approximation register (SAR) ADC comprising a first DAC 441, a first subtractor 443, a second subtractor 444, a comparator module 446 and a second DAC 448; and the feedback circuit 450 comprises a second delay circuit 452 and a third DAC 454.

In this embodiment, the CTDSM 400 is configured to receive an input signal (analog signal) Vin to generate a multi-bit output signal (digital signal) Dout, and the first ADC 430 and the second ADC 440 within the CTDSM 400 are configured to generate different parts of the output signal Dout at different times to fully use the entire sampling period.

Specifically, in the operations of the CTDSM 400, the receiving circuit 10 receives the input signal Vin and a feedback signal VFB to generate a first signal V1, and the loop filter 420 filters the first signal V1 to generate a filtered signal V1'. Then, the first ADC 430 samples the filtered signal V1' via the first switch SW1 controlled by a clock signal CLK to generate a first digital signal D1, where the first ADC 430 can be regarded as a course ADC for generating the MSB(s) of the output signal Dout of the CTDSM 400. Then, the second ADC 440 samples the filtered signal V1' via the second switch SW2 controlled by a second clock signal CLK' to generate a second digital signal D2, where the second clock signal CLK' generated by using the first delay circuit 460 to delay the first clock signal CLK, and the second ADC 440 is configured to generate the LSB(s) of the output signal Dout of the CTDSM 400. In detail, because the phase of the second clock signal CLK' is later than the first clock signal CLK, the first digital signal D1 may be successfully determined before the second ADC 440 starts to sample the filtered signal V1'. Therefore, the first DAC 441 performs the digital-to-analog converting operations upon the first digital signal D1 to generate an analog signal, and the first subtractor 443 subtracts the analog signal from the filtered signal V1' to generate a residual signal, and the second subtractor 444 subtracts a feedback signal outputted by the second DAC 448 from the residual signal to generate a second signal, and the comparator module 446 processes the second signal to generate the second digital signal D2, and the second DAC 448 receives the second digital signal D2 to generate the feedback signal to the second subtractor 444. Then, the combiner 442 combines the first digital signal D1 and the second digital signal D2 to generate the output signal Dout, and the output signal Dout is processed by the second delay circuit 452 and the second DAC 454 to generate the feedback signal VFB.

The timing diagram of the CTDSM 400 is also referred to the embodiment shown in FIG. 2. The first delay circuit 460 is configured to provide a first delay amount Td1 (i.e. the second clock signal CLK' and the first clock signal CLK have a phase difference Td1), and the second delay circuit 452 is configured to provide a second delay amount Td2, where a summation of the first delay amount Td1 and the second delay amount Td2 is less than or equal to a sampling period Ts (e.g. one cycle of CLK/CLK').

In the embodiment shown in FIG. 4, because the overall decision time of the CTDSM 400 is doubled (i.e. periods Td1 and Td2 are used for bit-decision), the second delay amount Td2 provided by the second delay circuit 452 can be kept the same as a conventional CTDSM to efficiently reduce the quantization noise in the low OSR CTDSM. In addition, because the second ADC 440 is the SAR ADC, some of the components shown in FIG. 1 (e.g. the first DAC 170) can be integrated into the second ADC 440.

Figure 5:
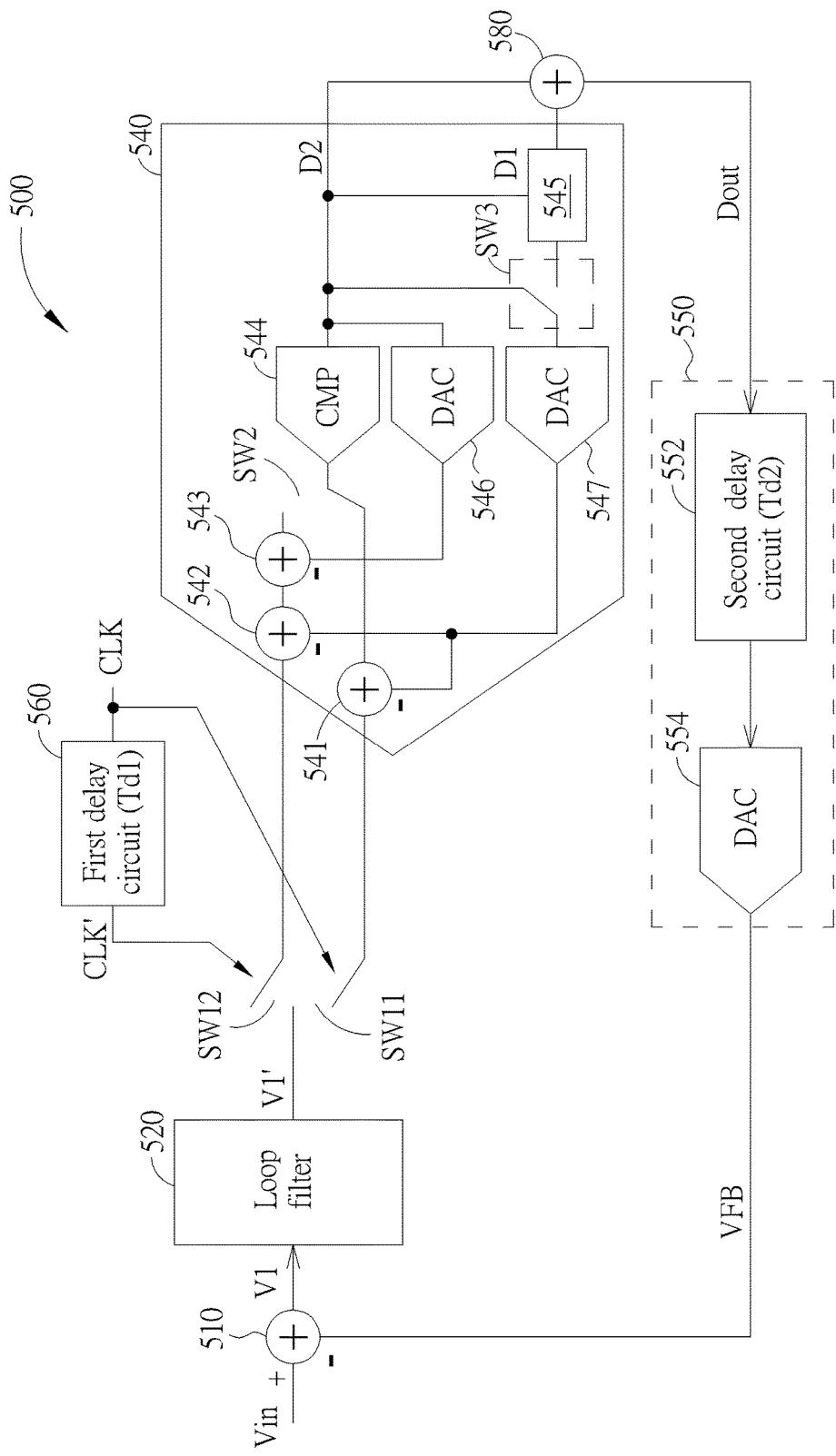
FIG. 5 is a diagram illustrating a CTDSM according to a fourth embodiment of the present invention.

FIG. 5 is a diagram illustrating a CTDSM 500 according to a fourth embodiment of the present invention. As shown in FIG. 5, the CTDSM 500 comprises a receiving circuit 510, a loop filter 520, an ADC 540, a combiner 580, a feedback circuit 550, a first delay circuit 560 and two switches SW11 and SW12, where the ADC 540 is a SAR ADC comprising three subtractors 541, 542 and 543, a comparator module 544, a delay circuit 545, two DACs 546 and 547, and two switches SW2 and SW3; and the feedback circuit 550 comprises a second delay circuit 552 and a DAC 554.

In this embodiment, the CTDSM 500 is configured to receive an input signal (analog signal) Vin to generate a multi-bit output signal (digital signal) Dout, and the ADC 540 within the CTDSM 100 are configured to generate different parts of the output signal Dout at different times to fully use the entire sampling period.

Specifically, in the operations of the CTDSM 500, the receiving circuit 510 receives the input signal Vin and a feedback signal VFB to generate a first signal V1, and the loop filter 520 filters the first signal V1 to generate a filtered signal V1'. Then, the ADC 540 samples the filtered signal V1' via the switch SW11 controlled by a first clock signal CLK to generate a first digital signal D1, then the ADC 540 samples the filtered signal V1' via the switch SW12 controlled by a second clock signal CLK' to generate a second digital signal D2, where the second clock signal CLK' is generated by using the first delay circuit 560 to delay the first clock signal CLK. In detail, at the beginning the switch SW11 is on, the switch SW12 is off, the switch SW2 is controlled to connect the subtractor 541 to the comparator module 544, and the switch SW3 is controlled to connect the comparator module 544 to the DAC 547. At this time, the subtractor 541 subtracts a feedback signal outputted by the DAC 547 from the filtered signal V1', and the comparator module 544 processes the output of the subtractor 541 to generate a first digital signal D1, wherein the first digital signal D1 can be regarded as MSB(s) of the output signal Dout. Then, after the first digital signal D1 is successfully determined, the switch SW11 is off, the switch SW12 is on, the switch SW2 is controlled to connect the subtractor 543 to the comparator module 544, and the switch SW3 is controlled to connect the delay circuit 545 to the DAC 547. At this time, the subtractor 542 subtracts a feedback signal outputted by the DAC 547 from the filtered signal V1', the subtractor 543 subtracts a feedback signal outputted by the DAC 546 from an output of the subtractor 542, and the comparator module 544 processes the output of the subtractor 543 to generate a second digital signal D2, wherein the second digital signal D2 can be regarded as LSB(s) of the output signal Dout. Then, the combiner 580 combines the first digital signal D1 and the second digital signal D2 to generate the output signal Dout, and the output signal Dout is processed by the second delay circuit 552 and the DAC 554 to generate the feedback signal VFB.

The timing diagram of the CTDSM 500 is also referred to the embodiment shown in FIG. 2. The first delay circuit 560 is configured to provide a first delay amount Td1 (i.e. the second clock signal CLK' and the first clock signal CLK have a phase difference Td1), the second delay circuit 552 is configured to provide a second delay amount Td2, and the delay circuit 545 is configured to provide the first delay amount Td1, where a summation of the first delay amount Td1 and the second delay amount Td2 is less than or equal to a sampling period Ts (e.g. one cycle of CLK/CLK').

In the embodiment shown in FIG. 5, because the overall decision time of the CTDSM 500 is doubled (i.e. periods Td1 and Td2 are used for bit-decision), the second delay amount Td2 provided by the second delay circuit 552 can be kept the same as a conventional CTDSM to efficiently reduce the quantization noise in the low OSR CTDSM. In addition, because the ADC 540 is the SAR ADC, compared with the embodiment shown in FIG. 1, some of the components shown in FIG. 1 can be integrated into the ADC 540.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A continuous-time delta-sigma modulator, comprising:
    a receiving circuit, for receiving an input signal and a feedback signal to generate a first signal;
    a loop filter, for filtering the first signal to generate a filtered signal;
    a first analog-to-digital converter (ADC), for sampling the filtered signal to generate a first digital signal;
    a second ADC, for sampling upon the filtered signal to generate a second digital signal;
    a combiner, for combining the first digital signal and the second digital signal to generate an output signal of the continuous-time delta-sigma modulator; and
    a feedback circuit, coupled to the first ADC and the second ADC, for generating at least one feedback signal according to the first digital signal and the second digital signal;
    wherein the first ADC and the second ADC sample the filtered signal at different times, and the first digital signal generated by the first ADC and the second digital signal generated by the second ADC are simultaneously provided to the feedback circuit.

2. The continuous-time delta-sigma modulator of claim 1, wherein the first digital signal is at least one bit of the output signal, the second digital signal is the other bits of the output signal.

3. The continuous-time delta-sigma modulator of claim 2, wherein the first digital signal and the second digital signal are generated during different periods.

4. A continuous-time delta-sigma modulator, comprising:
    a receiving circuit, for receiving an input signal and a feedback signal to generate a first signal;
    a loop filter, for filtering the first signal to generate a filtered signal;
    a first analog-to-digital converter (ADC), for sampling the filtered signal to generate a first digital signal;
    a second ADC, for sampling upon the filtered signal to generate a second digital signal;
    a combiner, for combining the first digital signal and the second digital signal to generate an output signal of the continuous-time delta-sigma modulator; and
    a feedback circuit, coupled to the first ADC and the second ADC, for generating at least one feedback signal according to the first digital signal and the second digital signal;
    a first switch coupled between an output node of the loop filter and the first ADC;
    a second switch coupled between the output node of the loop filter and the second ADC;
    wherein the first ADC and the second ADC sample the filtered signal at different times, and the first digital signal generated by the first ADC and the second digital signal generated by the second ADC are provided to the feedback circuit;
    wherein the first switch is controlled by a first clock signal, and the second switch is controlled by a second clock signal whose phase is different from a phase of the first clock signal, to make the first ADC and the second ADC sample the filtered signal at different times.

5. The continuous-time delta-sigma modulator of claim 4, further comprising:
    a first DAC, coupled to the first ADC, for performing digital-to-analog converting operations upon the first digital signal to generate an analog signal; and
    a subtractor, coupled between the first ADC, the DAC and the first switch, for subtracting the analog signal from the filtered signal to generate a residual signal;
    wherein the second ADC performs analog-to-digital converting operations upon the residual signal to generate the second digital signal.

6. The continuous-time delta-sigma modulator of claim 4, further comprising:
    a first delay circuit, for delaying the first clock signal to generate the second clock signal.

7. The continuous-time delta-sigma modulator of claim 6, wherein the feedback circuit comprises:
    a second delay circuit, for delaying the output signal to generate a delayed output signal; and
    a second digital-to-analog converter (DAC), coupled to the second delay circuit and the receiving circuit, for performing the digital-to-analog converting operations upon the delayed output signal to generate feedback signal.

8. The continuous-time delta-sigma modulator of claim 7, wherein the first delay circuit is configured to provide a first delay amount, the second delay circuit is configured to provide a second delay amount, and a summation of the first delay amount and the second delay amount is equal to or less than a cycle of the first clock signal.

9. The continuous-time delta-sigma modulator of claim 6, wherein the feedback signal comprises a first feedback signal and a second feedback signal, and the feedback circuit comprises:
- a second delay circuit, for delaying the second digital signal to generate a delayed second digital signal;
- a second DAC, coupled to the second delay circuit and the receiving circuit, for performing the digital-to-analog converting operations upon the delayed second digital signal to generate the first feedback signal;
- a third delay circuit, for delaying the first digital signal to generate a delayed first digital signal; and
- a third DAC, coupled to the third delay circuit and the receiving circuit, for performing the digital-to-analog converting operations upon the delayed first digital signal to generate the second feedback signal.

10. The continuous-time delta-sigma modulator of claim 9, wherein the first delay circuit is configured to provide a first delay amount, the second delay circuit is configured to provide a second delay amount, the third delay circuit is configured to provide a third delay amount, and the third delay amount is equal to a summation of the first delay amount and the second delay amount.

11. The continuous-time delta-sigma modulator of claim 10, wherein a summation of the first delay amount and the second delay amount is equal to or less than a cycle of the first clock signal.

12. The continuous-time delta-sigma modulator of claim 4, wherein the second ADC comprises:
- a first DAC, coupled to the first ADC, for performing digital-to-analog converting operations upon the first digital signal to generate an analog signal;
- a first subtractor, coupled between the first DAC and the first switch, for subtracting the analog from the filtered signal to generate a residual signal;
- a second subtractor, coupled to the first subtractor, for subtracting another feedback signal from the residual signal to generate a second signal;
- a comparator module, for processing the second signal to generate the second digital signal; and
- a second DAC, coupled to the comparator module and the second subtractor, for receiving the second digital signal to generate the other feedback signal.

13. A continuous-time delta-sigma modulator, comprising:
- a receiving circuit, for receiving an input signal and a feedback signal to generate a first signal;
- a loop filter, for filtering the first signal to generate a filtered signal;
- a analog-to-digital converter (ADC), for sampling the filtered signal to generate a first digital signal, and sampling the filtered signal to generate a second digital signal at different times;
- a combiner, for combining the first digital signal and the second digital signal to generate an output signal of the continuous-time delta-sigma modulator; and
- a feedback circuit, coupled to the ADC, for generating at least one feedback signal according to the first digital signal and the second digital signal;
- a first switch coupled between an output node of the loop filter and the ADC;
- a second switch coupled between the output node of the loop filter and the ADC;
- wherein the first switch is controlled by a first clock signal, and the second switch is controlled by a second clock signal whose phase is different from a phase of the first clock signal, to make the ADC samples the filtered signal to generate the first digital signal and the ADC samples the filtered signal to generate the second digital signal at different times.

14. The continuous-time delta-sigma modulator of claim 13, wherein the first digital signal is at least one bit of the output signal, the second digital signal is the other bits of the output signal.

15. The continuous-time delta-sigma modulator of claim 14, wherein the first digital signal and the second digital signal are generated during different periods.

\* \* \* \* \*